US009105627B2

(12) United States Patent
Shapiro et al.

(10) Patent No.: US 9,105,627 B2
(45) Date of Patent: Aug. 11, 2015

(54) COIL INDUCTOR FOR ON-CHIP OR ON-CHIP STACK

(75) Inventors: Michael J. Shapiro, Austin, TX (US); Gary D. Carpenter, Austin, TX (US); Alan J. Drake, Austin, TX (US); Rachel Gordin, Haifa (IL); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 607 days.

(21) Appl. No.: 13/289,071

(22) Filed: Nov. 4, 2011

(65) Prior Publication Data

US 2013/0113448 A1 May 9, 2013

(51) Int. Cl.
*H01F 5/00* (2006.01)
*H01L 27/08* (2006.01)
*H01L 23/498* (2006.01)
*H01L 23/522* (2006.01)
*H01L 23/64* (2006.01)
*H01L 49/02* (2006.01)
*H01F 17/00* (2006.01)
*H01F 41/00* (2006.01)

(52) U.S. Cl.
CPC ...... *H01L 23/49822* (2013.01); *H01F 17/0013* (2013.01); *H01L 23/5227* (2013.01); *H01L 23/645* (2013.01); *H01L 28/10* (2013.01); *H01F 41/005* (2013.01); *H01F 2017/0086* (2013.01); *H01L 2224/16225* (2013.01); *H01L 2224/32225* (2013.01); *H01L 2224/48227* (2013.01); *H01L 2224/73265* (2013.01); *H01L 2924/01322* (2013.01); *H01L 2924/15311* (2013.01); *H01L 2924/30107* (2013.01)

(58) Field of Classification Search
CPC .......... H01F 17/0013; H01F 2017/002; H01F 17/0006; H01F 41/041; H01F 5/003; H01F 41/005; H01F 2017/0086; H01F 27/2804; H01L 23/49827; H01L 23/49822; H01L 28/10
USPC ................. 336/199, 200, 205, 207, 208, 223; 257/531; 29/602.1
See application file for complete search history.

(56) References Cited

U.S. PATENT DOCUMENTS

| | | | |
|---|---|---|---|
| 3,614,554 A * | 10/1971 | Shield et al. .................. | 257/531 |
| 6,992,557 B2 * | 1/2006 | Aoyagi ....................... | 336/200 |
| 7,388,462 B2 | 6/2008 | Ahn et al. | |
| 7,414,508 B2 * | 8/2008 | Okuzawa et al. ............. | 336/200 |
| 7,728,427 B2 | 6/2010 | Gabara | |

(Continued)

*Primary Examiner* — Alexander Talpalatski
*Assistant Examiner* — Joselito Baisa
(74) *Attorney, Agent, or Firm* — L. Jeffrey Kelly; H. Daniel Schnurmann

(57) ABSTRACT

A coil inductor and buck voltage regulator incorporating the coil inductor are provided which can be fabricated on a microelectronic element such as a semiconductor chip, or on an interconnection element such as a semiconductor, glass or ceramic interposer element. When energized, the coil inductor has magnetic flux extending in a direction parallel to first and second opposed surfaces of the microelectronic or interconnection element, and whose peak magnetic flux is disposed between the first and second surfaces. In one example, the coil inductor can be formed by first conductive lines extending along the first surface of the microelectronic or interconnection element, second conductive lines extending along the second surface of the microelectronic or interconnection element, and a plurality of conductive vias, e.g., through silicon vias, extending in direction of a thickness of the microelectronic or interconnection element. A method of making the coil inductor is also provided.

12 Claims, 5 Drawing Sheets

(56) References Cited

U.S. PATENT DOCUMENTS

| | | | |
|---|---|---|---|
| 7,868,727 B2* | 1/2011 | Chen et al. | 336/200 |
| 7,935,570 B2 | 5/2011 | Lin et al. | |
| 7,956,713 B2* | 6/2011 | Chandrasekhar et al. | 336/200 |
| 2003/0034867 A1* | 2/2003 | Berthold et al. | 336/200 |
| 2008/0001698 A1* | 1/2008 | Hazucha et al. | 336/200 |
| 2011/0084765 A1 | 4/2011 | Kim et al. | |
| 2011/0128111 A1 | 6/2011 | Roozeboom et al. | |

* cited by examiner

COIL INDUCTOR FOR ON-CHIP OR ON-CHIP STACK

BACKGROUND OF THE INVENTION

The present invention relates to semiconductor devices and their manufacture, and more specifically to a structure and method of making a coil inductor on a semiconductor chip, on an interconnection device, or on a plurality of stacked semiconductor chips.

For certain applications it is desirable to provide an inductor having a relatively large inductance value on a microelectronic element such as a semiconductor integrated circuit chip, or on an interconnection element such as an interposer for electrical connection with a microelectronic element in a microelectronic package. A relatively large inductance value is needed when the inductor is used in a power supply voltage regulator, such as a buck voltage regulator commonly used to step up or step down a voltage from one direct current (DC) supply voltage to another. Heretofore, buck voltage regulators have been implemented as devices mounted to a circuit board rather than on microelectronic elements or interconnection elements.

Heretofore, on-chip inductor structures have suffered from insufficient inductance per unit area of the surface of the microelectronic element. It is common for on-chip inductor structures to be formed as a spiral disposed in a plane parallel to a front or a rear planar surface of the chip. The magnetic flux in a spiral inductor extends in a direction perpendicular to the planar surfaces of the chip, making it hard to achieve sufficiently high inductance with a spiral inductor. Moreover, in on-chip inductors, an input end of the inductor can be disposed relatively far from an output end of the inductor, which can reduce the effective inductance.

In light of the foregoing, further improvements can be made to a coil inductor incorporated on a microelectronic element or interconnection element, and to a method of making such inductor.

SUMMARY OF THE INVENTION

According to an aspect of the invention, a microelectronic element is provided which includes a continuous coil inductor thereon. The microelectronic element includes a semiconductor chip embodying a plurality of active devices, the semiconductor chip having first and second opposed surfaces. The coil inductor includes a plurality of conductive vias extending in a direction between the first and second surfaces, first electrically conductive lines extending along the first surface, and second electrically conductive lines extending along the second surface. When energized, the coil inductor has magnetic flux extending in a direction parallel to the first and second surfaces. The peak magnetic flux of the coil inductor is disposed between the first and second surfaces. Moreover, in such coil inductor, it is possible to dispose an output end of the coil inductor at a location that is displaced from the input end of the coil inductor by no more than 10% of a length of the path of the magnetic flux between the input end and the output end of the coil inductor.

In an embodiment, the conductive vias and first and second conductive lines can be arranged to form the coil inductor having a continuous helical structure.

In a particular embodiment, the conductive vias and the first and second conductive lines can be arranged to form the coil inductor as a first helical coil intertwined with a second helical coil in a double helix structure. In a particular embodiment, the coil inductor can be configured, i.e., constructed, designed, adapted, or capable of to direct the magnetic flux in a toroidal path.

In a particular embodiment, the coil inductor may have a first plurality of turns configured to direct the magnetic flux in a first straight path extending in a first direction parallel to the first and second surfaces, and a second plurality of turns configured to direct the magnetic flux in a second straight path extending in a second direction opposite the first direction. The coil inductor may further have a reversing portion configured to direct the flux between the first and second pluralities of turns.

In a particular embodiment, some of the first conductive lines can extend in parallel paths in a direction transverse to each of said first and second directions and at least some of the second conductive lines can extend in parallel paths orthogonal to the first direction.

A buck voltage regulator may include a microelectronic element having a coil inductor thereon according to any of the afore-mentioned embodiments.

According to another aspect of the invention, an interconnection element is provided which has a continuous coil inductor thereon, the interconnection element including an element including at least one of semiconductor, glass or ceramic material, the element having first and second opposed surfaces and a thickness between the first and second opposed surfaces of less than 1000 microns. The coil inductor includes conductive vias extending in a direction of the thickness of the element, first electrically conductive lines extending along the first surface, and second electrically conductive lines extending along the second surface. When energized, the coil inductor has magnetic flux extending in a direction parallel to the first and second surfaces and whose peak magnetic flux is disposed between the first and second surfaces. Similar to the microelectronic element according to the embodiments of the invention, it is possible for an output end of the coil inductor to be displaced from the input end of the coil inductor by no more than 10% of a length of the path of the magnetic flux between the input end and the output end of the coil inductor.

The interconnection element can be incorporated in a microelectronic assembly which may further include a semiconductor chip embodying a plurality of active devices, and a substrate having a plurality of terminals thereon configured for connecting the microelectronic assembly with a component external to the microelectronic assembly. In such microelectronic assembly, the terminals can be electrically connected with the semiconductor chip through conductive structure on the interconnection element.

According to another aspect of the invention, a method is provided for making an element having a coil inductor thereon, the element configured for connection within a microelectronic package. Such method can include forming a continuous coil inductor on an element including at least one of semiconductor, glass or ceramic material, the element having first and second opposed surfaces and a thickness between the first and second surfaces of less than 1000 microns. The coil inductor can include a plurality of conductive vias extending in a direction of the thickness, first electrically conductive lines extending along the first surface, and second electrically conductive lines extending along the second surface. When energized, the coil inductor has magnetic flux extending in a direction parallel to the first and second surfaces. The peak magnetic flux of the coil inductor can be disposed between the first and second surfaces. It is possible for the coil inductor to be formed such that an output end of the coil inductor is displaced from the input end of the coil inductor by no more than 10% of a length of the path of the magnetic flux between the input end and the output end of the coil inductor.

DETAILED DESCRIPTION

Accordingly, a coil inductor structure is provided which can be fabricated on a microelectronic element such as a semiconductor chip, or interconnection element such as a semiconductor, glass or ceramic interposer element, which when energized has magnetic flux extending in a direction parallel to first and second opposed surfaces of the microelectronic or interconnection element, and whose peak magnetic flux is disposed between the first and second surfaces. The coil inductor can include first conductive lines extending along the first surface of the microelectronic or interconnection element, second conductive lines extending along the second surface of the microelectronic or interconnection element, and a plurality of conductive vias, e.g., through silicon vias, extending in a direction of a thickness of the microelectronic or interconnection element. Embodiments of the invention further provide a coil inductor which is configured to couple the magnetic flux directly between an output and an input of the coil inductor.

Figure 1:
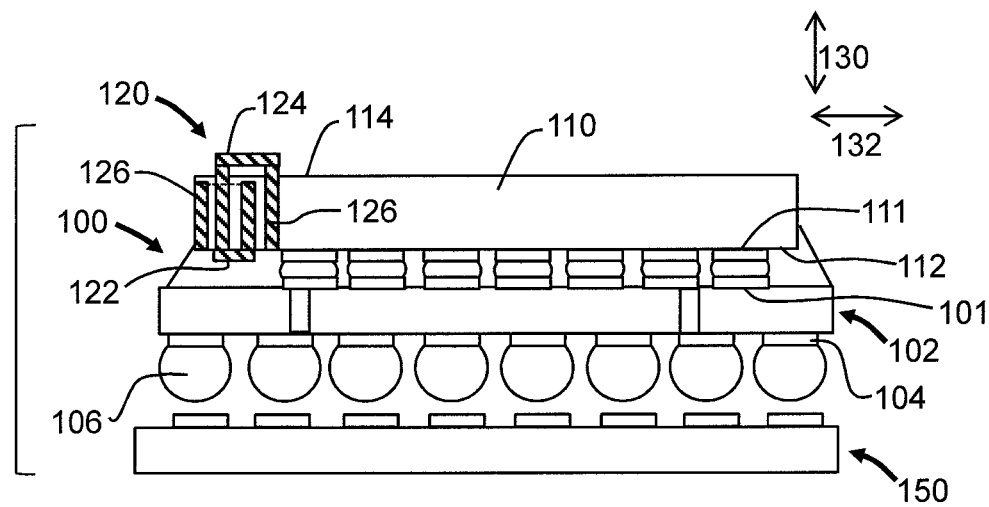
FIG. 1 is a sectional view illustrating a microelectronic package including a microelectronic element having a coil inductor thereon according to an embodiment of the invention.

FIG. 1 illustrates a microelectronic package 100 incorporating a microelectronic element 110 having a coil inductor 120 formed thereon in accordance with an embodiment of the invention. As illustrated in FIG. 1, the microelectronic element 110 can be a semiconductor chip which embodies a plurality of active semiconductor devices, such as an integrated circuit chip, for example. In a particular example, the microelectronic element 110 can be a logic or processor chip, or may be a semiconductor chip or more than one semiconductor chip with additional conductive structure thereon such as a conductive redistribution layer. Such microelectronic element can contain area arrays of contacts 111 on the surface which faces the substrate 102 of a package. In a particular embodiment, the coil inductor 120 may be part of a buck voltage regulator, such as may be used in the microelectronic package to step up or step down a first direct current (DC) power supply voltage to a second DC power supply voltage. The coil inductor of the various embodiments described herein may be capable of attaining a relatively high inductance on a microelectronic element or similarly-sized interconnection element while occupying a relatively small area of a first surface of the microelectronic element or interconnection element. Thus, attaining an inductance of 27 nanoHenry or greater is possible for a coil inductor constructed in accordance with an embodiment of the invention due to its unique construction, as described below. A buck voltage regulator which incorporates a coil inductor having such inductance can be especially useful for stepping down voltages on a semiconductor integrated circuit chip, particularly one which incorporates one or more processor cores. Thus, in one example of use, multiple buck voltage regulators incorporating coil inductors of this construction on the same semiconductor chip can be used to generate power supply voltages for independently controlling power supply voltage levels provided to individual processor cores of a multiple processor core integrated circuit ("IC"). Thus, one buck voltage regulator on the IC can power a particular processor core of the IC at a power supply voltage selected specifically for that particular processor core, while another buck voltage regulator can power another processor core of the same IC at a different power supply voltage selected specifically for that processor core. Moreover, the provision of multiple buck voltage regulators on the same integrated circuit chip can allow some processor cores on the IC to operate in high performance mode while permitting other processor cores on the same IC to operate in moderate or low performance mode when not needed for high performance operation. In such way, the provision of multiple buck voltage regulators on a single IC together with other circuitry used to implement logic, e.g., a multiple processor core IC, can address power supply and heat dissipation concerns within an IC.

In the microelectronic package seen in FIG. 1, a first surface 112 of the microelectronic element can have a plurality of electrically conductive contacts 111 thereon which face corresponding contacts 101 of a package substrate 102 and are joined thereto, such as with a bond metal, e.g., solder, tin, indium or a eutectic material, or other electrically conductive bond material. In turn, the substrate contacts 101 are electrically connected with a plurality of terminals 104 of the package. The terminals 104 are endpoints configured for electrically and mechanically connecting the microelectronic package with a component external to the package, such as with a circuit panel 150, e.g., a circuit board, for example. As further shown in FIG. 1, the terminals may include a bond metal or bond material attached thereto for joining the terminals with corresponding contacts of the external component, e.g., circuit board 150.

As will be further described below, the coil inductor 120 includes first electrically conductive lines 122 extending along a first surface 112 of the microelectronic element and second electrically conductive lines 124 extending along a second surface 114 of the microelectronic element which is opposite the first surface. Electrically conductive vias 126 extend in directions 130 of a thickness of the microelectronic element and electrically connect the first and second conductive lines 122, 124. With this structure, the coil inductor 120 when energized has magnetic flux which extends in a direction 132 parallel to the first and second surfaces. Moreover, with this structure, the peak magnetic flux exists between the first and second surfaces 112, 114 of the microelectronic element 110. Further description of the structure of the coil inductor is provided below with reference to particular embodiments below.

Figure 2:
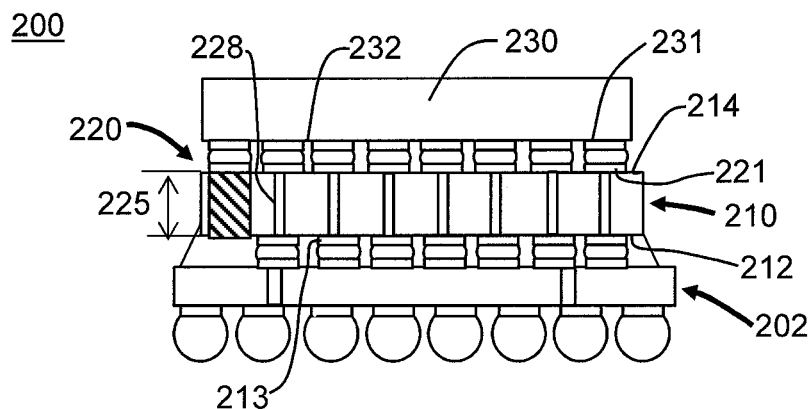
FIG. 2 is a sectional view illustrating a microelectronic package including an interconnection element having a coil inductor thereon according to an embodiment of the invention, wherein terminals of the package can be electrically interconnected with a semiconductor chip within the package by conductive structure on the interconnection element.

As shown in FIG. 2, in a microelectronic package 200 according to an alternative embodiment, a coil inductor 220 having a structure as described above can be provided on an interconnection element 210 which typically includes a region of semiconductor, glass or ceramic material that makes up a majority of the thickness 225 of the interconnection element. The thickness typically is less than 1000 microns. The interconnection element 210 can be an interposer configured to electrically interconnect a semiconductor chip adjacent a second surface 214 thereof with a substrate 202 adjacent a first surface 212 surface thereof. The interconnection element 210 may be electrically interconnected with the package substrate 202 in like manner as the electrical interconnection between the microelectronic element 110 and the substrate 102, as described above relative to FIG. 1. In the example shown in FIG. 2, the microelectronic element 230 can be electrically interconnected with the interconnection element 210 through contacts 231 at a surface 232 of the microelectronic element which face corresponding contacts 221 at a surface 214 of the interconnection element 210 adjacent thereto, the contacts 231 being joined with the contacts 221 of the interconnection element. The interconnection element 210 may include conductive through vias 228 which electrically connect the contacts 221 facing the microelectronic element with contacts 213 on the first surface 212 which have electrically conductive joints with corresponding contacts on the substrate 202.

Figure 3:
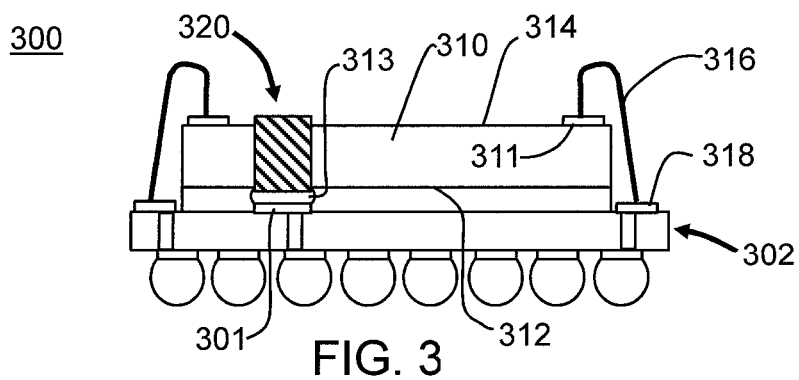
FIG. 3 is a sectional view illustrating a microelectronic package including a microelectronic element having a coil inductor thereon according to another embodiment of the invention.

FIG. 3 illustrates a microelectronic package 300 according to another embodiment in which the coil inductor 320 and the substrate 302 having terminals thereon can be similar to those described above relative to FIG. 1. However, in this case, the coil inductor 320 is formed on a microelectronic element 310 which has a plurality of contacts 311 on a second surface 314 which faces away from the substrate 302. The contacts 311 are electrically connected with the substrate 302, such as with wire bonds 316 connected to corresponding contacts 318 on the substrate 302. FIG. 3 further illustrates that the coil inductor can optionally be electrically interconnected with the substrate by electrically connecting the a contact of the inductor 320 exposed at a first surface 312 of the substrate with corresponding contacts 301 on the substrate 302 such as with a bond metal or electrically conductive bond material.

Figure 4:
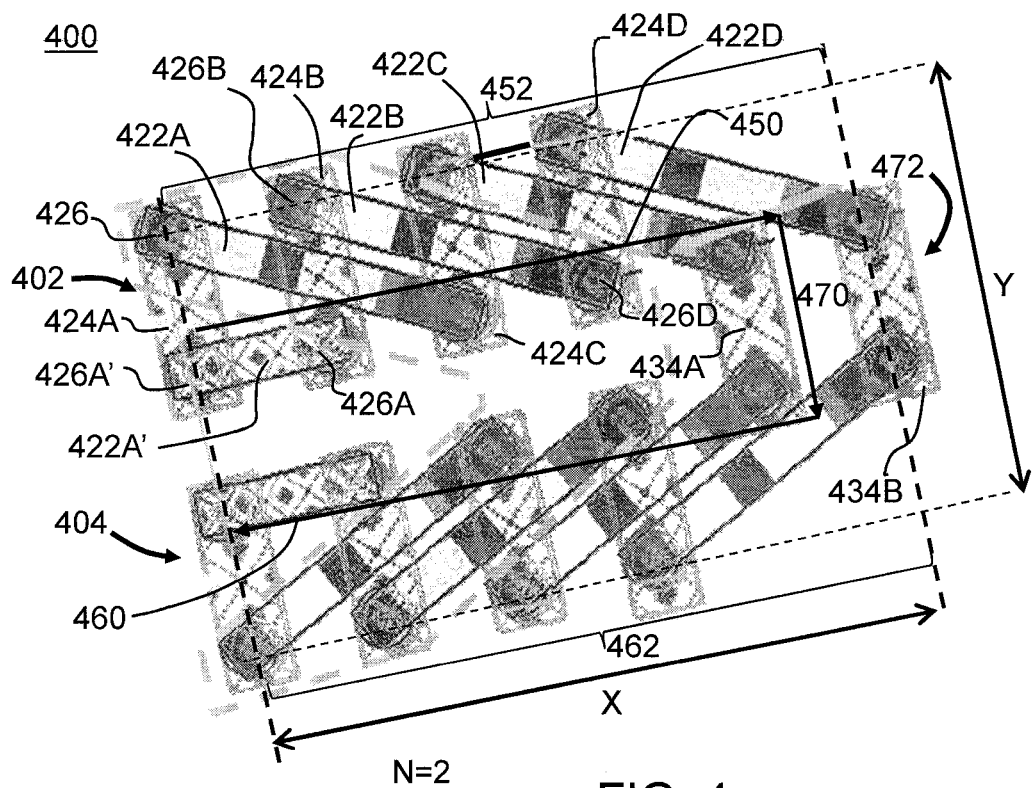
FIG. 4 is a plan view illustrating a structure of a coil inductor on a microelectronic element or interconnection element according to an embodiment of the invention.

FIG. 4 illustrates the structure of a coil inductor 400 which can be formed on any of the microelectronic element 110, 310 or interconnection element 210 described above. As shown therein, the coil inductor can have a continuous helical structure formed by the first conductive lines 422A', 422A, 422B, etc. on the first surface of the element (microelectronic or interconnection element), the second conductive lines 424A, 424B, 424C, etc. on the second surface of the element, and the conductive vias 426, 426A', 426A, 426B, etc. which extend in a direction of the thickness of the element and electrically connect the first conductive lines with the second conductive lines. Typically, the conductive vias extend entirely through the thickness of a semiconductor, glass or ceramic region of the element such that first and second conductive lines which are exposed at first and second opposing surfaces of the semiconductor, glass or ceramic region, respectively, contact the conductive vias.

Thus, as seen in FIG. 4, a helical coil inductor 400 is formed as a continuous electrically conductive path from second conductive line 424A through conductive via 426A', first conductive line 422A', conductive via 426A, second conductive line 424B, conductive via 426B, first conductive line 422B, conductive via 426D, second conductive line 424D, and first conductive line 422D. As further shown in FIG. 4, the coil inductor is arranged as a first helical coil intertwined with a second helical coil in a double helix structure. Specifically, it can be seen that a second coil is formed by first conductive line 422A and first conductive line 422C and the second conductive lines 424 and 424C and the conductive vias which electrically connect these particular first and second conductive lines. It is also seen that the second coil is intertwined with the first coil formed by the first conductive lines 422A', 422B, and 422D, the second conductive lines 424B and 424D, and the conductive vias which electrically connect these first and second conductive lines.

One will appreciate that the helical coil inductor encloses a volume which is internal to the semiconductor, glass or ceramic region that makes up the majority of the element's (microelectronic or interconnection element's) thickness. Moreover, the coil inductor has a first plurality of turns 452 configured to generate magnetic flux which extends in a straight path in a direction 450 in a plane parallel to the first surface of the element. Specifically, in the example shown in FIG. 4, the coil inductor has a number N=2 of units of conductive double helical structures which repeat in the direction 450. It can also be seen that at least some of the first conductive lines 422A, 422B, 422C, 422D extend in a direction transverse to the direction in which the magnetic flux extends. In addition, it can be seen that at least some of the second conductive lines 424, 424B, 424C, 424D extend in parallel paths which are orthogonal to the first direction 450.

As further shown in FIG. 4, the coil inductor includes a second plurality of turns 462 which are configured to direct the magnetic flux in a direction 460 opposite the direction 450. Here, in the example shown in FIG. 4, the coil inductor has a number N=2 of units of conductive double helical structures which repeat in the direction 460 which is opposite the direction 450. Connecting the first and second plurality of turns is a reversing portion 472 which is configured to direct the magnetic flux in a direction 470 directly between the first plurality of turns 452 and the second plurality of turns 462. In a particular example, two units of the conductive double helical structures as described above can have a dimension X in the directions 450, 460 of 250 microns. In addition, the dimension Y of the coil inductor in a direction 470 transverse to the directions 450, 460 may be 150 microns. As further seen in FIG. 4, the coil inductor 400 is a continuous coil which directs the magnetic flux between an input end of the coil 402 and an output end 404 of the coil which is displaced from the input end by a distance no greater than 10% of a maximum dimension of the path of the magnetic flux through the coil.

Figure 5:
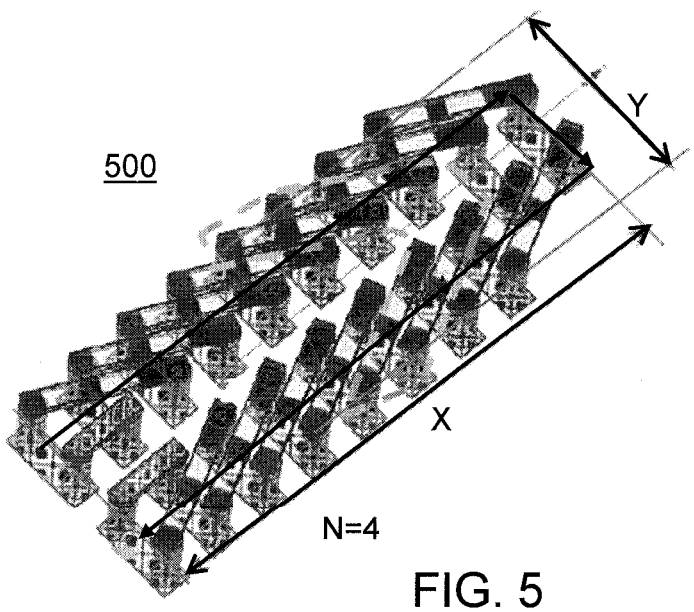
FIG. 5 is a perspective view illustrating a structure of a coil inductor on a microelectronic element or interconnection element according to an embodiment of the invention.

FIG. 5 illustrates another example of a coil inductor 500 as described above with respect to FIG. 4. However, in this case, a coil inductor is shown in which the number N of units of the conductive double helical structures equals 4. In this case, the dimension X of the coil inductor 500 in a first direction can be 450 microns, and the dimension Y of the coil inductor 500 in a second direction transverse to the first direction can be 150 microns.

Figure 6:
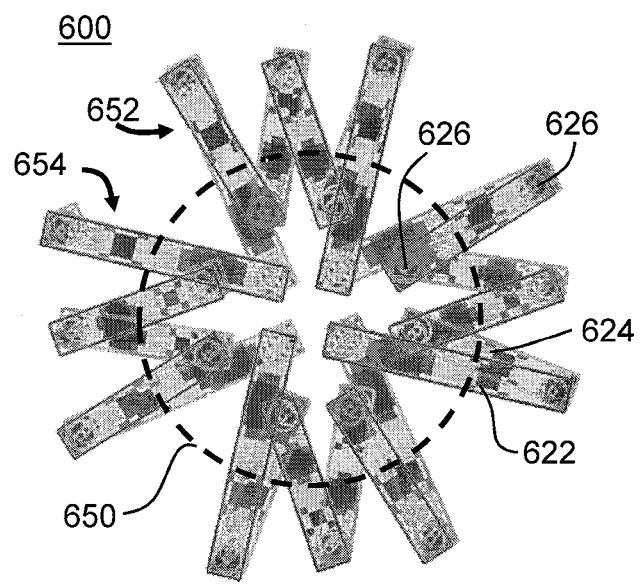
FIG. 6 is a plan view illustrating a structure of a coil inductor on a microelectronic element or interconnection element according to an embodiment of the invention.

FIG. 6 illustrates another example of a coil inductor 600 which can be arranged instead as a single helical structure which is configured to direct the magnetic flux in a toroidal path. For example, the coil inductor 600 can be arranged to direct the magnetic flux in a circular toroidal path 650. The coil inductor 600 is constructed of first conductive lines 622 on a first surface of the microelectronic or interconnection element, and are electrically connected with second conductive lines 624 on the second surface of the microelectronic or interconnection element on the first surface thereof by electrically conductive vias 626. As shown in FIG. 6, the magnetic flux is directed from an input terminal 652 at one end of the toroidal path 650 to an output terminal 654 at another end of the toroidal path 650. In this example, there are places on the toroidal path where the first and second conductive lines are arranged closely together, with some of the first conductive lines extending in directions parallel or nearly parallel to the second conductive lines. One will appreciate that the coil inductor 600 is a continuous coil which directs the magnetic flux between an input end of the coil 652 and an output end 654 of the coil which is displaced from the input end by a distance no greater than 10% of a maximum dimension (circumference) of the path 650 of the magnetic flux through the coil.

Figure 7:
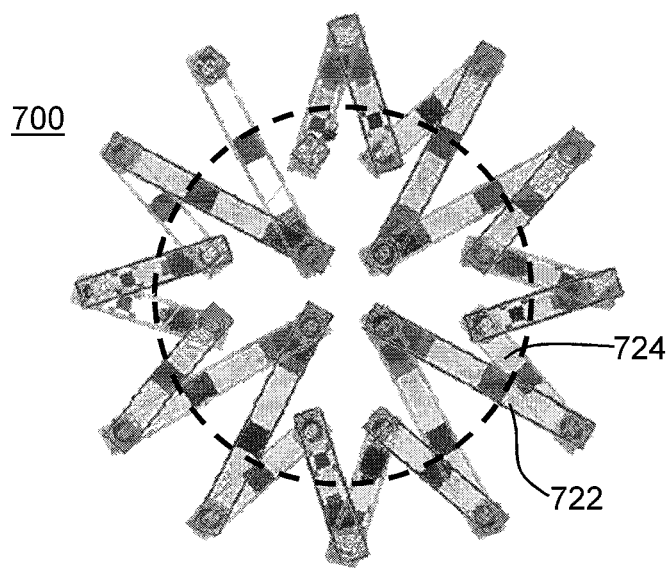
FIG. 7 is a plan view illustrating a structure of a coil inductor on a microelectronic element or interconnection element according to an embodiment of the invention.

FIG. 7 illustrates a toroidal coil inductor 700 similar to the coil inductor 600 in which the first and second conductive lines are arranged somewhat differently. In this case, none of the first conductive lines 722 therein extends in a direction parallel to or nearly parallel to the second conductive lines 724. Otherwise, the coil inductor 700 has the same characteristics and features of the toroidal coil inductor 600.

A method of making an element configured for connection within a microelectronic package is further provided which includes a coil inductor, such element being a microelectronic element such as a semiconductor chip or an interconnection element, e.g., an interposer within the package. Such method can include forming a coil inductor on an element including at least one of semiconductor, glass or ceramic material, the element having first and second opposed surfaces and a thickness between the first and second surfaces of less than 1000 microns, wherein the coil inductor includes a plurality of conductive vias extending in a direction of the thickness, first electrically conductive lines extending along the first surface, and second electrically conductive lines extending along the second surface. When energized, the coil inductor has magnetic flux extending in a direction parallel to the first and second surfaces and whose peak magnetic flux is disposed between the first and second surfaces. In addition, an output end of the coil inductor is displaced from the input end of the coil inductor by no more than 10% of a length of the path of the magnetic flux between the input end and the output end of the coil inductor.

Figure 8:
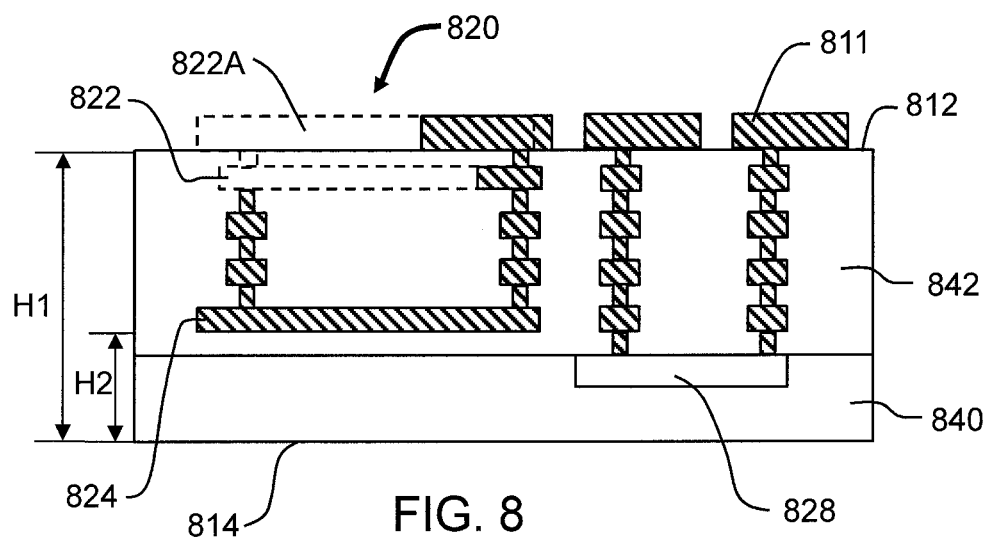
FIG. 8 is a sectional view illustrating a coil inductor according to an embodiment of the invention which is formed using metal wiring layers and vias disposed above a semiconductor region of a semiconductor chip.

FIG. 8 is a sectional view illustrating a coil inductor according to an embodiment of the invention which is formed using metal wiring layers disposed above a semiconductor region of a semiconductor chip and vias which electrically connect the wiring layers. Thus, a coil inductor 820 having a structure as generally described above relative to FIG. 4, 5, 6 or 7 can be formed by conductive structure formed above a semiconductor region 840 of a semiconductor chip 830. For example, the semiconductor chip may include one or more active semiconductor devices having portions in a device region 828 thereof which are electrically connected to conductive contacts 811 of the chip by a series of metal wiring layers and vias extending through a dielectric region 842 made typically made up of a series of dielectric layers. These metal layers may be "back end of line" (BEOL) metal layers, as they are typically done by processing after "front end of line" (FEOL) processing which forms active semiconductor devices on the chip.

Thus, in one embodiment, the coil inductor can be formed using first conductive lines which extend along a first surface 812 of the chip and which are disposed at a first height H1 relative to a second, opposite surface 814 of the chip. The first conductive lines may be exposed at the first surface 812 as in the case of first conductive lines 822A or may be disposed below the first surface 812 of the chip as in the case of first conductive lines 822. The second conductive lines 824 are disposed at a second height H2 which is below the first height and thus deeper within the dielectric region 842 from the front surface 812.

Figure 9:
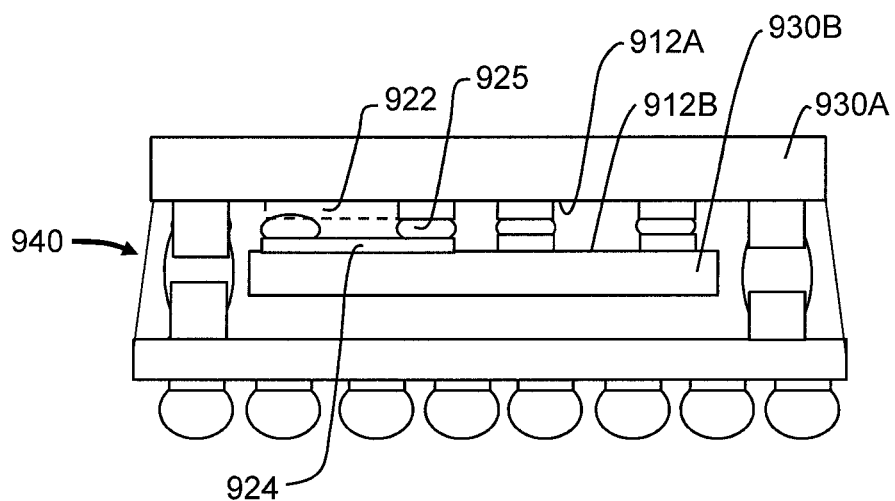
FIG. 9 is a sectional view illustrating a coil inductor according to an embodiment of the invention which is formed using metal wiring layers extending along confronting surfaces of first and second semiconductor chips and electrically conductive joints between them.

FIG. 9 is a sectional view illustrating a coil inductor according to an embodiment of the invention which is formed using first and second conductive lines 922, 924 extending along confronting surfaces 912A, 912B of first and second semiconductor chips 930A, 930B and electrically conductive joints 925 between the first and second chips. The conductive joints 925 can include electrically conductive bumps including a bond metal such as solder, tin, indium, gold or other electrically conductive bond material. Thus, as seen in FIG. 9, first and second chips 930A, 930B can be flip-chip bonded to one another and assembled together in a package as illustrated in FIG. 9, with electrically conductive connections 940 extending from at least one of the first or second chips to a substrate having terminals thereon.

Figure 10:
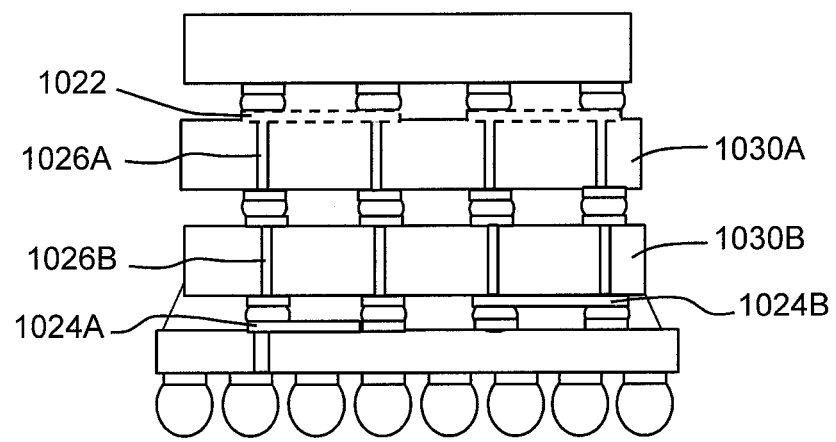
FIG. 10 is a sectional view illustrating a coil inductor according to an embodiment of the invention which is formed using through vias within a stack of semiconductor chips and metal layers extending parallel to surfaces of first and second semiconductor chips.

FIG. 10 is a sectional view illustrating a coil inductor 1020 according to an embodiment of the invention which is formed using through vias 1026A, 1026B within a stack of semiconductor chips 1030A, 1030B and metal layers, i.e., conductive lines 1022, 1024A or 1024B extending parallel to surfaces of first and second semiconductor chips. Thus, for example, first conductive lines 1022 can extend along a surface 1012A of a first semiconductor chip and second conductive lines 1022 can extend along a second surface 1014B of a second semiconductor chip 1030B, and be electrically connected therewith by through vias extending through one or more of the first and second chips 1030A, 1030B. It is also possible for there to be one or more additional semiconductor chips or other structure between the first and second chips 1030A, 1030B such that a coil inductor is formed having an electrically conductive current path which extends through one or more of the first and second chips 1030A, 1030B and the one or more additional semiconductor chips or conductive structure between the first and second chips.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of making an element having a coil inductor thereon, the element being configured for connection within a microelectronic package, the method comprising:

forming a continuous coil inductor on an element including at least one of semiconductor, glass or ceramic material, the element having a first and a second opposed surfaces and a thickness between the first and the second surfaces of less than 1000 microns, the continuous coil inductor including first electrically conductive lines extending along the first surface, second electrically conductive lines extending along the second surface, and a plurality of conductive vias extending in a direction between the first and second surfaces and coupling the first and second electrically conductive lines, wherein the plurality of conductive vias and the first and second electrically conductive lines are arranged to form a first helical coil intertwined with a second helical coil in a double helix structure, wherein when energized, the continuous coil inductor has magnetic flux extending in a direction parallel to the first and second surfaces and whose peak magnetic flux is disposed between the first and second surfaces, wherein an output end of the continuous coil inductor is displaced from an input end of the coil inductor by no more than 10% of a length of a path of the magnetic flux between the input end and the output end of the continuous coil inductor, and wherein the continuous coil inductor includes a first plurality of turns configured to direct the magnetic flux in a first straight path extending in a first direction, and includes a second plurality of turns configured to direct the magnetic flux in a second straight path parallel to and extending in a second direction opposite the first direction, the first straight path being separated from the second straight path by a distance approximately equal to the displacement between the input end and the output end.

2. The method of claim 1, wherein the electrically conductive structure and first and second electrically conductive lines are arranged to form the continuous coil inductor having a continuous helical structure.

3. The method of claim 1, wherein the continuous coil inductor includes a reversing portion configured to direct the flux between the first and second pluralities of turns.

4. The method of claim 1, wherein at least some of the first electrically conductive lines extend in parallel paths in a direction transverse to each of said first and second directions and at least some of the second electrically conductive lines extend in parallel paths orthogonal to the first direction.

5. The method of claim 1, wherein the first electrically conductive lines are overlie the first surface of the element, the second electrically conductive lines overlie the second surface of the element and the conductive structure includes through vias extending entirely through a thickness of a semiconductor region of the element.

6. The method of claim 1, wherein the conductive structure does not extend through a semiconductor region of the element.

7. A coil inductor comprising:
first electrically conductive lines extending along the first surface of a semiconductor chip comprising a second surface opposite the first surface, the first electrically conductive lines disposed at a first height relative to the second surface;
second electrically conductive lines extending parallel to the second surface, the second electrically conductive lines disposed at a second height relative to the second surface, the second height being below the first height; and
an electrically conductive structure extending in a direction between the first and second surfaces and coupling the first and second conductive lines,
wherein the electrically conductive structure and the first and second electrically conductive lines are arranged to form a first helical coil intertwined with a second helical coil in a double helix structure,
wherein when energized, the coil inductor has magnetic flux extending in a direction parallel to the first and second surfaces and whose peak magnetic flux is disposed between the first and second surfaces,
wherein an output end of the coil inductor is displaced from an input end of the coil inductor by no more than 10% of a length of a path of the magnetic flux between the input end and the output end of the coil inductor,
wherein the coil inductor includes a first plurality of turns configured to direct the magnetic flux in a first straight path extending in a first direction, and includes a second plurality of turns configured to direct the magnetic flux in a second straight path parallel to and extending in a second direction opposite the first direction, the first straight path being separated from the second straight path by a distance approximately equal to the displacement between the input end and the output end.

8. The coil inductor of claim 7, wherein the electrically conductive structure and first and second electrically conductive lines are arranged to form the coil inductor having a continuous helical structure.

9. The coil inductor of claim 7, wherein the coil inductor includes a reversing portion configured to direct the flux between the first and second pluralities of turns.

10. The coil inductor of claim 7, wherein at least some of the first electrically conductive lines extend in parallel paths in a direction transverse to each of said first and second directions and at least some of the second electrically conductive lines extend in parallel paths orthogonal to the first direction.

11. The coil inductor of claim 7, wherein the first electrically conductive lines are overlie the first surface of the semiconductor chip, the second electrically conductive lines overlie the second surface of the semiconductor chip and the conductive structure includes through vias extending entirely through a thickness of a semiconductor region of the semiconductor chip.

12. The coil inductor of claim 7, wherein the conductive structure does not extend through a semiconductor region of the semiconductor chip.

* * * * *